(12) United States Patent
Weng et al.

(10) Patent No.: US 8,314,885 B2
(45) Date of Patent: Nov. 20, 2012

(54) IMAGE-CLOCK ADJUSTING CIRCUIT AND METHOD

(75) Inventors: Jen-Chung Weng, Hsinchu (TW); Jar-Lin Chen, Hsinchu (TW)

(73) Assignee: Holtek Semiconductor Inc., Hsinchu (TW)

( * ) Notice: Subject to any disclaimer, the term of this patent is extended or adjusted under 35 U.S.C. 154(b) by 1240 days.

(21) Appl. No.: 12/111,623

(22) Filed: Apr. 29, 2008

(65) Prior Publication Data
US 2008/0309818 A1    Dec. 18, 2008

(30) Foreign Application Priority Data
Jun. 15, 2007   (TW) ................................ 96121955 A

(51) Int. Cl.
*H03L 7/00* (2006.01)
(52) U.S. Cl. ....................................................... 348/537
(58) Field of Classification Search ................... 348/537
See application file for complete search history.

(56) References Cited

U.S. PATENT DOCUMENTS

| | | | |
|---|---|---|---|
| 4,686,673 A | 8/1987 | Hotta | |
| 5,144,156 A * | 9/1992 | Kawasaki | .................. 327/157 |
| 5,491,673 A | 2/1996 | Okayasu | |
| 5,801,780 A * | 9/1998 | Schaumont et al. | .......... 348/441 |
| 6,107,890 A | 8/2000 | Carson et al. | |
| 2005/0200704 A1 | 9/2005 | Kodake et al. | |
| 2005/0253941 A1 | 11/2005 | Taura | |
| 2006/0164366 A1 | 7/2006 | Yu et al. | |
| 2006/0187347 A1 * | 8/2006 | Tsai | ............................. 348/500 |

FOREIGN PATENT DOCUMENTS

| | | |
|---|---|---|
| JP | 2004140767 A | 5/2004 |
| JP | 2005354292 A | 12/2005 |

* cited by examiner

*Primary Examiner* — Brian Pendleton
*Assistant Examiner* — Olugbenga Idowu
(74) *Attorney, Agent, or Firm* — Volpe and Koenig, P.C.

(57) ABSTRACT

An image-clock adjusting circuit is provided and includes a phase comparator, a clock controller, and a timing generator. The phase comparator receives a power source signal and a vertical synchronous signal and compares a phase of the power source signal with that of the first vertical synchronous signal for producing at least a phase comparison signal. The clock controller receives the phase comparison signal and the vertical synchronous signal, produces a pixel clock signal and intermittently adjusts a clock width of the pixel clock signal. The timing generator receives the pixel clock signal and adjusts the vertical synchronous signal into an adjusted vertical synchronous signal being nearly in phase with the power source signal. Therefore, The effect suppressing the phenomenon of the color rolling with the simpler circuit is accomplished.

18 Claims, 6 Drawing Sheets

IMAGE-CLOCK ADJUSTING CIRCUIT AND METHOD

FIELD OF THE INVENTION

The present invention relates to an image-clock adjusting circuit and method, and more particularly to an image-clock adjusting circuit and method for suppressing a phenomenon of color rolling.

BACKGROUND OF THE INVENTION

An electronic vision system includes an image pickup mechanism and an image-processing unit. The image pickup mechanism includes a pickup camera and a lighting apparatus. The image-processing unit includes an image processor, a television coder, and an image display unit.

The image pickup element of the pickup camera includes a photo-sensor. The photo-sensor currently used mostly involve a charge coupled device (CCD) or a complementary metal-oxide semiconductor (CMOS) device.

It is the principle generating light of the fluorescent lamp of the lighting apparatus that a fluorescent light is excited on when electrons emitted from two electrode terminals impact fluorescent substances on the inside surface of the lamp in the electrified state. For lighting with the fluorescent lamp, it is necessary to solve the flicker problem. The illumination intensity of the fluorescent lamp changes with the waveform of the AC power source and has a frequency equal to that (such as 60 Hz) of the AC power source. Though it is not easy for eyes of men to detect the flicker of the fluorescent lamp due to persistence of vision, the CCD of the pickup camera cannot pick up correct images under the circumstances of this light source.

It is the main objective of the image processor that the processor receives visual information transmitted from the CCD of the pickup camera, converts the information into digital image data for storing into an image storage unit, and can perform image processing and analyzing. As the image processor must fit with the CCD of the pickup camera, the specification of the used image signal between the image processor and the pickup camera must also agree. Two kinds of the common color visual information standards are NTSC and PAL.

The television coder converts the digital image signal output from the image processor into an analogue compound signal or an analogue television signal with both brightness and color difference being separate for providing to the television set or the image display unit to display.

The pixel field frequency of the NTSC monitoring system is 59.94 fields/sec, and the flicker frequency of the fluorescent lamp is generally also 60 Hz in the state the power frequency being 60 Hz. Not considering the correlation between the two frequencies, under the circumstances of the fluorescent lamp, as the integral value of the light amount in each pixel field is different, the photo sensing state of the CCD sensor in the each pixel field can be different from that of another, which makes the photo sensing distributions be not even among the pixel fields. Therefore, the phenomenon known as the color rolling occurs; that is, the image will vary periodically, which makes one unable to accept. The current general solutions all have that additional devices are appended to an external circuit, which dynamically adjusts an external clock frequency, for providing the frequency to the image processor to use. In this way, not only increases the cost but it is not easy to exactly adjust the external devices.

A prior art solving the phenomenon of the color rolling is disclosed in the US Publication No. 2005/0253941. In this prior art, main color signals are extracted from an image signal received. Integral data of each color signal are calculated according to the main color signals extracted. Whether the phenomenon of the color rolling begins to occur is determined according to the variation of the integral data of the each color signal. When the phenomenon of the color rolling is detected, a high-speed white balance is used for suppressing the phenomenon.

Another prior art solving the phenomenon of the color rolling is disclosed in the US Publication No. 2005/0200704. In this prior art, a solid-state image pickup device produces an image pickup signal. A light amount detector detects a light amount injecting into the solid-state image pickup device. A correction circuit receiving the light amount detects periodical variations of the light amount, and corrects the image pickup signal according to the periodical variations.

The two above prior arts both includes steps of detecting the incident light of the light source, obtaining the color variation through analyzing, and correcting the image signal picked up for suppressing the phenomenon of the color rolling. In this way, the complexity and the whole cost of the image processing will be increased.

In sum, how to suppress the phenomenon of the color rolling with a simpler circuit and a lower cost becomes the primary motive of the present invention.

SUMMARY OF THE INVENTION

It is therefore an aspect of the present invention to provide an image-clock adjusting circuit including a phase comparator, a clock controller, and a timing generator. The phase comparator receives a power source signal and a vertical synchronous signal and compares a phase of the power source signal with that of the first vertical synchronous signal for producing at least a phase comparison signal. The clock controller receives the phase comparison signal and the vertical synchronous signal, produces a pixel clock signal and intermittently adjusts a clock width of the pixel clock signal. The timing generator receives the pixel clock signal and adjusts the vertical synchronous signal into an adjusted vertical synchronous signal being nearly in phase with the power source signal. Therefore, The effect suppressing the phenomenon of the color rolling with the simpler circuit is accomplished.

It is therefore another aspect of the present invention to provide an image-clock adjusting method. The method includes the following steps. Firstly, comparing a phase of a power source signal with that of a first vertical synchronous signal produces at least a phase comparison signal. Next, a pixel clock signal with a first clock width intermittently adjusted is produced based on the phase comparison signal and the first vertical synchronous signal. Next, a second vertical synchronous signal with a first phase approaching to the phase of the power source signal is produced by finely adjusting the first vertical synchronous signal based on the pixel clock signal. Therefore, The effect suppressing the phenomenon of the color rolling with the economical method is accomplished.

The above objects and advantages of the present invention will become more readily apparent to those ordinarily skilled in the art after reviewing the following detailed descriptions and accompanying drawings, in which:

DETAIL DESCRIPTION OF THE PREFERRED EMBODIMENT

The present invention will now be described more specifically with reference to the following embodiments. It is to be noted that the following descriptions of preferred embodiments of this invention are presented herein for the purposes of illustration and description only; it is not intended to be exhaustive or to be limited to the precise form disclosed.

Figure 1:
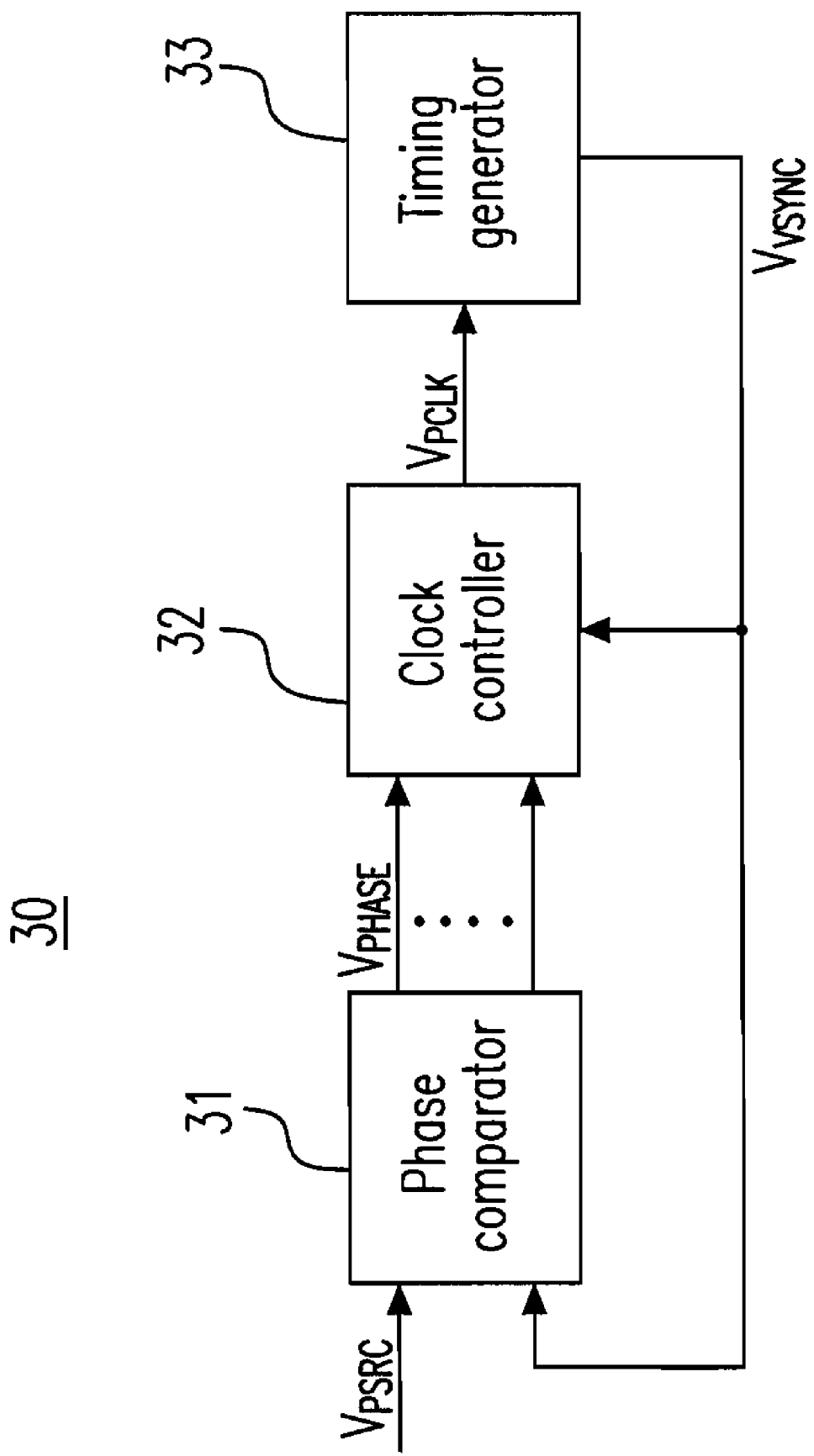
FIG. 1 is a schematic block diagram showing an image-clock adjusting circuit according to the first embodiment of the present invention.

Please refer to FIG. 1, which is a schematic block diagram showing an image-clock adjusting circuit according to the first embodiment of the present invention. In FIG. 1, the image-clock adjusting circuit 30 includes a phase comparator 31, a clock controller 32, and a timing generator 33.

The phase comparator 31 receives a power source signal $V_{PSRC}$ and a vertical synchronous signal $V_{VSYNC}$ and comparing a phase of the power source signal $V_{PSRC}$ with that of the vertical synchronous signal $V_{VSYNC}$ for producing at least a phase comparison signal $V_{PHASE}$ including information of a phase difference between the two signals $V_{PSRC}$ and $V_{VSYNC}$. A pixel frame having a complete image is displayed on a picture area by combining two interlaced scanning pixel fields according to the color visual information standard of NTSC, wherein each pixel frame has 525 scanning lines and the frequency of the each pixel frame is 59.94 frames/sec. While the color visual information standard of NTSC is adopted, the standard frequency of the vertical synchronous signal $V_{VSYNC}$ is 59.94 Hz. While the frequency of an alternating-current voltage used therewith is 60 Hz, the frequency of the power source signal $V_{PSRC}$ is also 60 Hz. In order to reduce the phenomenon of the color rolling, the frequency of the vertical synchronous signal $V_{VSYNC}$ is adjusted, which makes the frequency of an adjusted vertical synchronous signal of the signal $V_{PSRC}$ be nearly equal to the frequency of the power source signal $V_{PSRC}$.

The clock controller 32 receives the phase comparison signal $V_{PHASE}$ and the vertical synchronous signal $V_{VSYNC}$, produces a pixel clock signal $V_{PCLK}$ and intermittently adjusts a first clock width of the pixel clock signal $V_{PCLK}$. There are positions corresponding to pixels to be displayed thereon in the picture area. The pixel clock signal $V_{PCLK}$ controls the times the pixels are displayed. The picture area includes a display area and a blanking area. The pixel clock signal $V_{PCLK}$ has clock periods, corresponding to positions of the pixels in the display area and the blanking area, and corresponds to the timing of the interlaced scans in the two pixel fields. The clock controller 32 obtains a phase relation between the power source signal $V_{PSRC}$ and the vertical synchronous signal $V_{VSYNC}$ for intermittently adjusting the first clock width of the pixel clock signal $V_{PCLK}$ according to the phase comparison signal $V_{PHASE}$ and the vertical synchronous signal $V_{VSYNC}$. Therefore, the display time of a position, being in the picture area, corresponding to at least a first pixel of the pixels can be finely adjusted.

The timing generator 33 receives the pixel clock signal $V_{PCLK}$ and finely adjusts the vertical synchronous signal $V_{VSYNC}$ into an adjusted vertical synchronous signal being nearly in phase with the power source signal $V_{PSRC}$ according to the result intermittently adjusting the first clock width, wherein the adjusted vertical synchronous signal is fed back to the phase comparator 31 and the clock controller 32, and becomes the vertical synchronous signal $V_{VSYNC}$. As the frequency of the vertical synchronous signal $V_{VSYNC}$ is equal to the frequency displaying pixel fields on the picture area, the frequency of the vertical synchronous signal $V_{VSYNC}$ or the frequency displaying pixel fields will be synchronous with or equal to the frequency of the power source signal $V_{PSRC}$ in this way, and the phase of the vertical synchronous signal $V_{VSYNC}$ is locked to the phase of the power source signal $V_{PSRC}$. At this time, because the frequency displaying pixel fields is equal to the frequency the fluorescent lamp flickering, the phenomenon of the color rolling is improved.

In FIG. 1, the clock controller 32 further presets an index variable and a range of the index variable, wherein the value of the index variable is set at a midpoint of the range as a preset value in an initial state. The clock controller 32 analyzes the phase comparison signal $V_{PHASE}$, and adjusts the value of the index variable according to the phase relation obtained from the power source signal $V_{PSRC}$ and the vertical synchronous signal $V_{VSYNC}$. Besides, the clock controller 32 intermittently adjusts the first clock width of the pixel clock signal $V_{PCLK}$ according to the value of the index variable.

A method for adjusting the value of the index variable gives that the value of the index variable is increased when the power source signal $V_{PSRC}$ leads the vertical synchronous signal $V_{VSYNC}$, and the value of the index variable is decreased when the power source signal $V_{PSRC}$ lags behind the vertical synchronous signal $V_{VSYNC}$. Another method for adjusting the value of the index variable gives that the value of the index variable is decreased when the power source signal $V_{PSRC}$ leads the vertical synchronous signal $V_{VSYNC}$, and the value of the index variable is increased when the power source signal $V_{PSRC}$ lags behind the vertical synchronous signal $V_{VSYNC}$. The following example is taken as an illustration. The range of the index variable is set as [0~N-1], wherein the number of steps able to be dynamically adjusted is an N totally and the N is an even number. The value of the index variable is set as N/2 in the initial state. When the clock controller 32 detects and obtains that the power source signal $V_{PSRC}$ leads the vertical synchronous signal $V_{VSYNC}$, 1 is subtracted from the value of the index variable. When the clock controller 32 detects and obtains that the power source signal $V_{PSRC}$ lags behind the vertical synchronous signal $V_{VSYNC}$, 1 is added to the value of the index variable.

Figure 2:
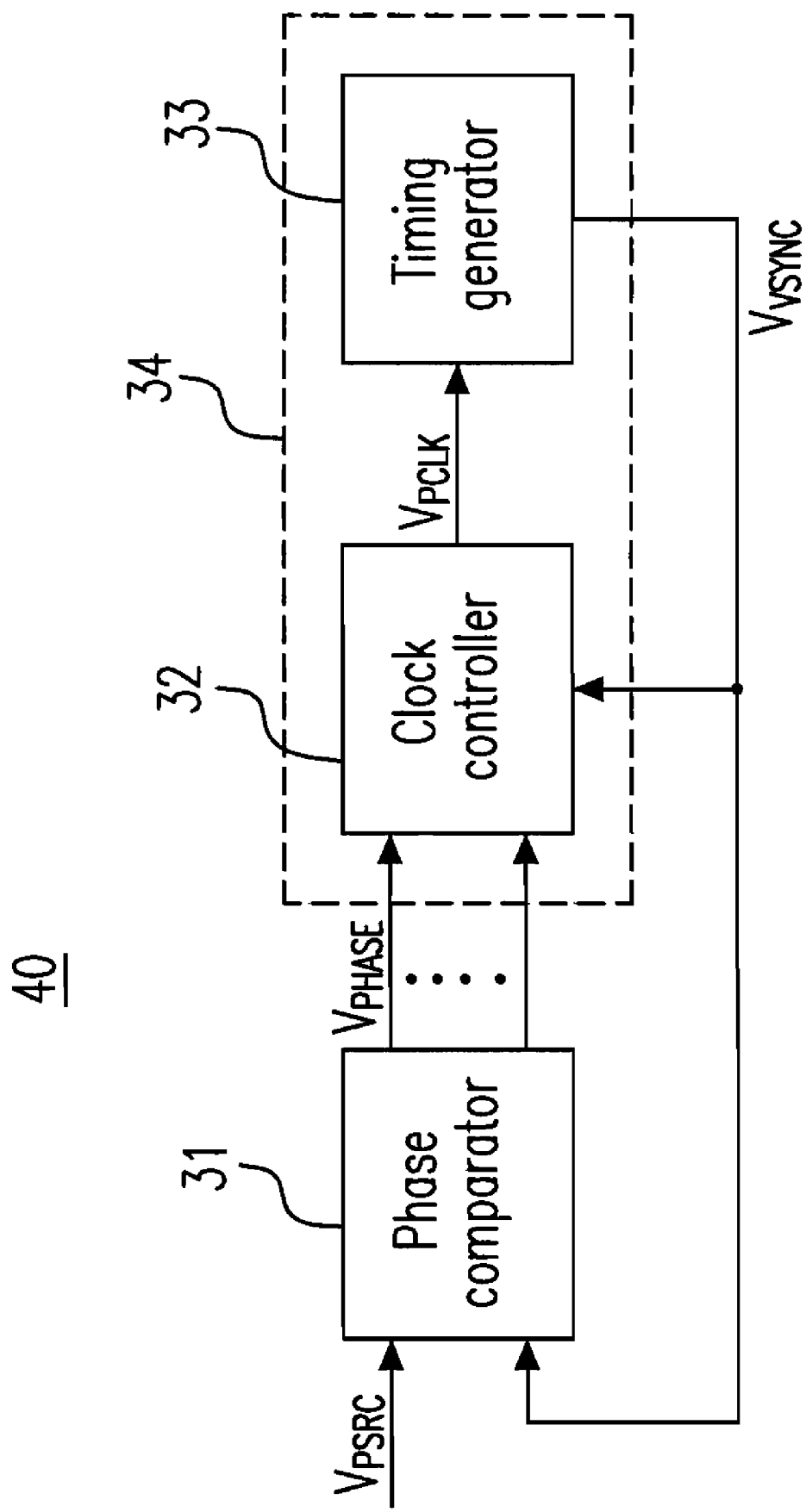
FIG. 2 is a schematic block diagram showing an image-clock adjusting circuit according to the second embodiment of the present invention.

Afterward, another configuration of the image-clock adjusting circuit 30 is described. Please refer to FIG. 2, which is a schematic block diagram showing an image-clock adjusting circuit according to the second embodiment of the present invention. The identical reference numerals have the same functions in FIG. 2 and FIG. 1. The characteristic of the circuit 40 configured in FIG. 2 gives that the clock controller 32 and the timing generator 33 are combined into a device; that is, the image-clock adjusting circuit 40 includes a phase comparator 31, and an integrated clock processor 34. The phase comparator 31 receives a power source signal $V_{PSRC}$ and a vertical synchronous signal $V_{VSYNC}$ and comparing a phase of the power source signal $V_{PSRC}$ with that of the vertical synchronous signal $V_{VSYNC}$ for producing at least a phase comparison signal $V_{PHASE}$. The integrated clock processor 34 is coupled to the phase comparator 31, has a first output terminal and a second output terminal, and receives the phase comparison signal $V_{PHASE}$ and the vertical synchronous signal $V_{VSYNC}$. The integrated clock processor 34 produces a pixel clock signal $V_{PCLK}$ with a first clock width intermittently adjusted thereby at the first output terminal, and produces an adjusted vertical synchronous signal, fed back as the vertical synchronous signal $V_{VSYNC}$, at the second output terminal with a phase approaching to the phase of the power source signal $V_{PSRC}$ by finely adjusting the vertical synchronous signal $V_{VSYNC}$.

Figure 3:
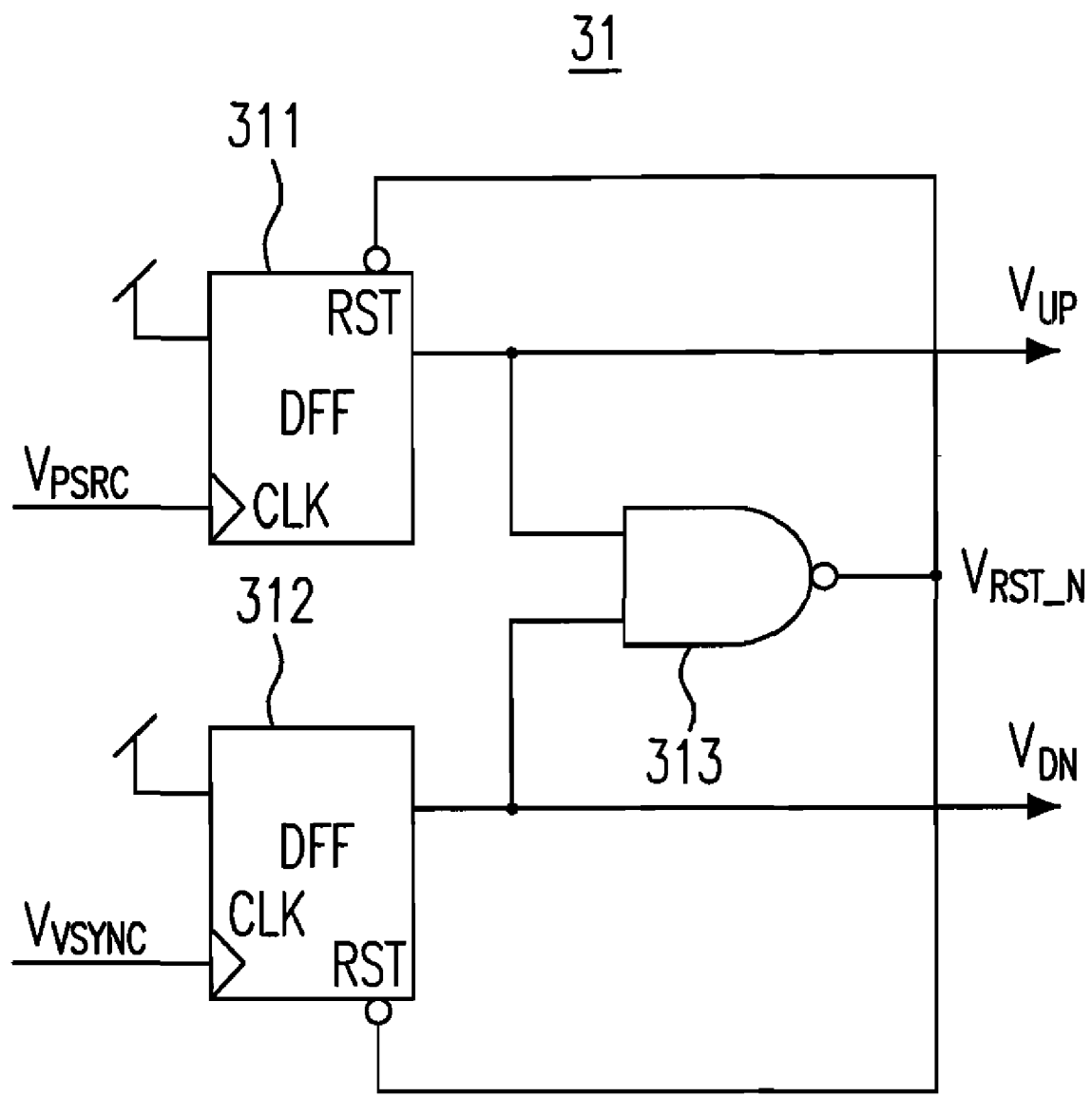
FIG. 3 is a schematic diagram showing a circuit for a phase comparator according to the third embodiment of the present invention.

Please refer to FIG. 3, which is a schematic diagram showing a circuit for a phase comparator according to the third embodiment of the present invention. In FIG. 3, the phase comparator 31 includes a first flip-flop 311, a second flip-flop 312 and a NAND gate 313, and produces a first comparison signal $V_{UP}$ and a second comparison signal $V_{DN}$. The first flip-flop 311 has a first clock input terminal CLK receiving the power source signal $V_{PSRC}$, and a first reset input terminal RST receiving a reset signal $V_{RST\_N}$, for producing the first comparison signal $V_{UP}$ of the phase comparison signal $V_{PHASE}$. The second flip-flop 312 has a second clock input terminal CLK receiving the vertical synchronous signal $V_{VSYNC}$, and a second reset input terminal RST receiving the reset signal $V_{RST\_N}$, for producing the second comparison signal $V_{DN}$ of the phase comparison signal $V_{PHASE}$. The NAND gate 313 receives the first comparison signal $V_{UP}$ and the second comparison signal $V_{DN}$ both reflecting the phase relation between the power source signal $V_{PSRC}$ and the vertical synchronous signal $V_{VSYNC}$ for producing the reset signal $V_{RST\_N}$.

In FIG. 3, the first comparison signal $V_{UP}$ produced has a first pulse when the power source signal $V_{PSRC}$ leads the vertical synchronous signal $V_{VSYNC}$, and the second comparison signal $V_{DN}$ produced has a second pulse when the power source signal $V_{PSRC}$ lags behind the vertical synchronous signal $V_{VSYNC}$.

Figure 4:
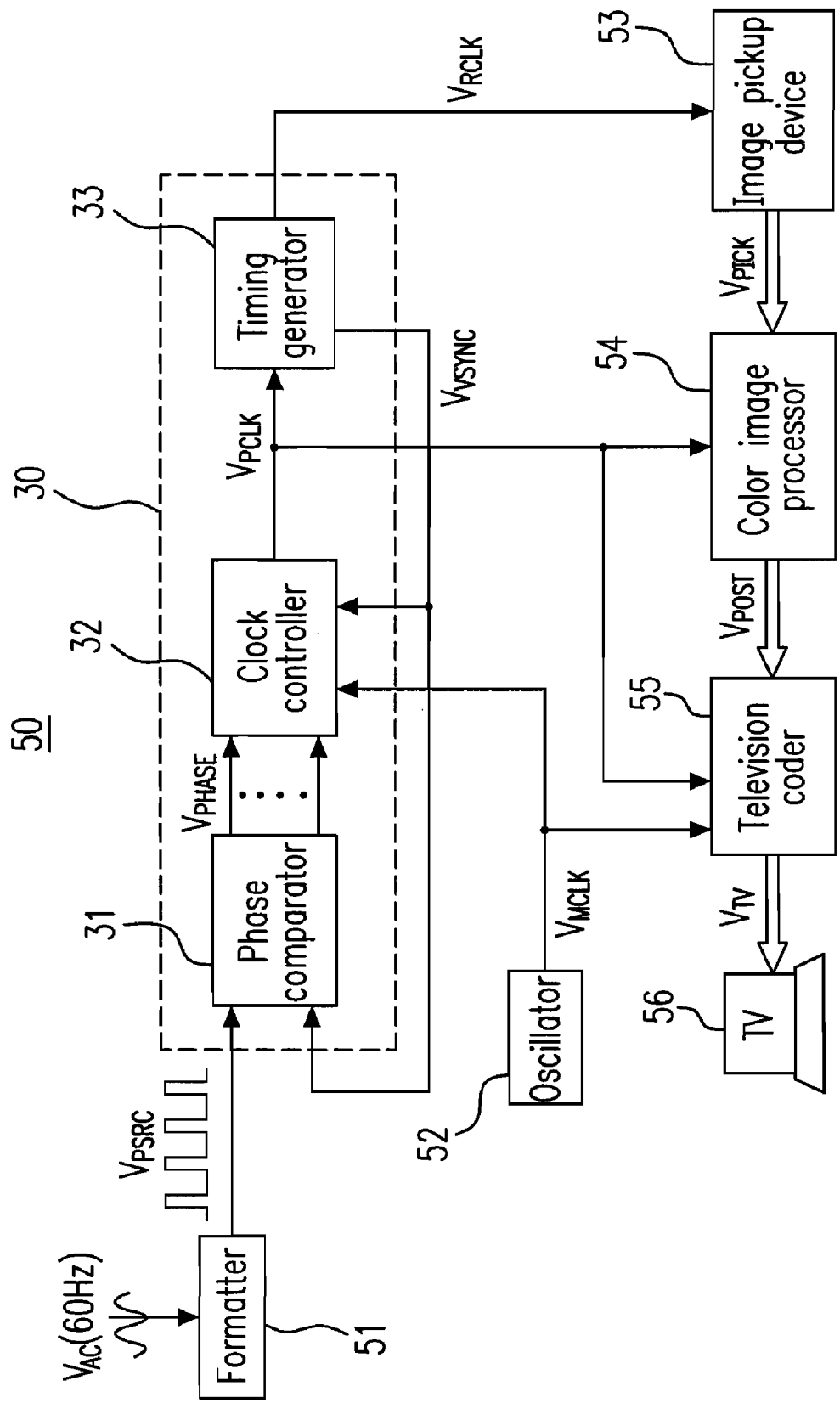
FIG. 4 is a schematic block diagram showing an application system of an image-clock adjusting circuit according to the fourth embodiment of the present invention.

Please refer to FIG. 4, which is a schematic block diagram showing an application system of the image-clock adjusting circuit according to the fourth embodiment of the present invention. The architecture of the application system 50 in FIG. 4 is based on that of the image-clock adjusting circuit 30 and has additional peripheral devices expanded from the circuit 30. The identical reference numerals have the same functions in FIG. 4 and FIG. 1. In FIG. 4, the application system 50 of the image-clock adjusting circuit 30 includes the image-clock adjusting circuit 30, a formatter 51, an oscillator 52, an image pickup device 53, a color image processor 54, a television coder 55, and an image display unit 56.

The image-clock adjusting circuit 30 includes the phase comparator 31, the clock controller 32, and the timing generator 33. The description of the circuit 30 is the same as that for FIG. 1. Besides, in FIG. 4, the timing generator 33 further produces an image pickup control signal $V_{RCLK}$ serving as a reference clock when the image pickup device 53 picks up an image according to the pixel clock signal $V_{PCLK}$.

The formatter receives an alternating-current voltage $v_{AC}$ for producing the power source signal $V_{PSRC}$ and providing the signal $V_{PSRC}$ to the phase comparator 31, wherein the frequency of the alternating-current voltage $v_{AC}$ is equal to that of the power source signal $V_{PSRC}$. The standard frequency of the alternating-current voltage $v_{AC}$ is 60 Hz in the present embodiment. However, the actual frequency is not fixed at 60 Hz and may have a little deviation. The aforementioned image-clock adjusting circuit 30 can adapt to the little frequency deviation, which makes the vertical synchronous signal $V_{VSYNC}$ be nearly in phase with the power source signal $V_{PSRC}$.

The oscillator 52 produces a main clock signal $V_{MCLK}$ and provides the signal $V_{MCLK}$ to the clock controller 32 and the television coder 55. The clock controller 32 refers to a period of the main clock signal $V_{MCLK}$ for intermittently adjusting the first clock width of the pixel clock signal. Of course, the frequency of the main clock signal $V_{MCLK}$ is constant. In a state the first clock width of the pixel clock signal $V_{PCLK}$ is not adjusted, the frequency of the main clock signal $V_{MCLK}$ is two, three, or other integer times as large as that of the pixel clock signal $V_{PCLK}$ according to different kinds of CCD sensors. When the clock controller 32 adjusts the first clock width of the pixel clock signal $V_{PCLK}$, the first clock width is adjusted based on the period of the main clock signal $V_{MCLK}$.

In the present embodiment, the image pickup device 53 includes CCD sensors, receives the image pickup control signal $V_{RCLK}$, and picks up an image according to the clock of the image pickup control signal $V_{RCLK}$ for producing an image pickup signal $V_{PICK}$.

The color image processor 54 receives the image pickup signal $V_{PICK}$ and the pixel clock signal $V_{PCLK}$ for producing an image post-processing signal $V_{POST}$. The television coder 55 receives the image post-processing signal $V_{POST}$, the main clock signal $V_{MCLK}$ and the pixel clock signal $V_{PCLK}$ for producing a display driving signal $V_{TV}$ and providing the signal $V_{TV}$ to the image display unit 56.

Figure 5A:
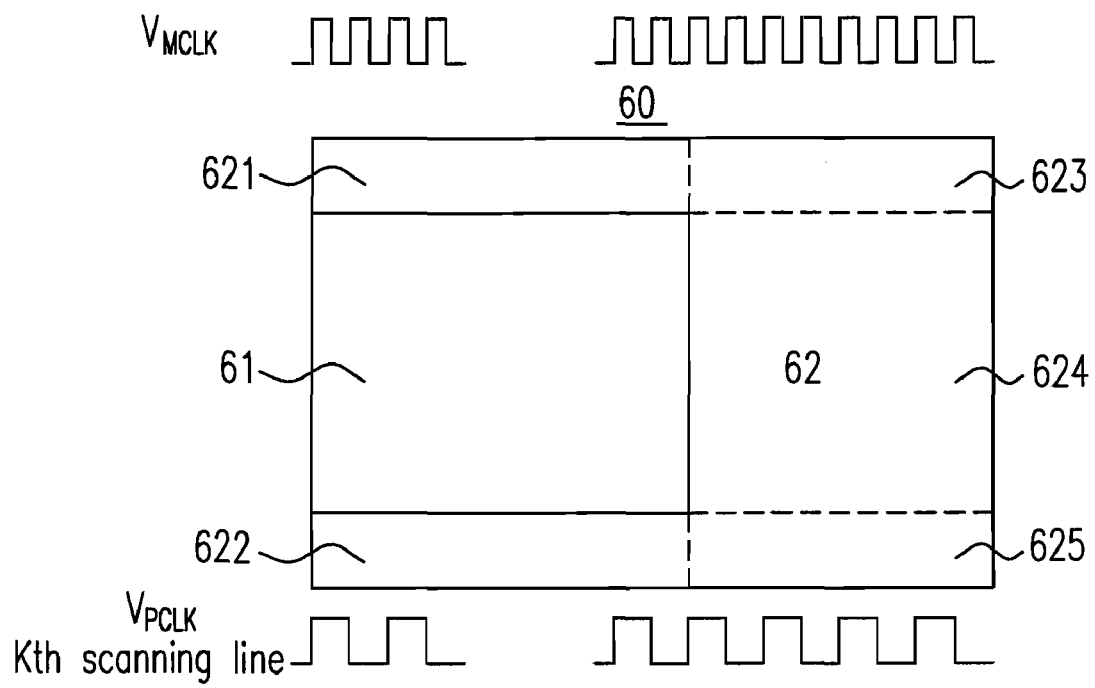
FIG. 5(a), FIG. 5(b) and FIG. 5(c) are schematic diagrams showing layouts of a picture area corresponding to a pixel clock signal according to the fifth embodiment of the present invention.
Figure 5B:
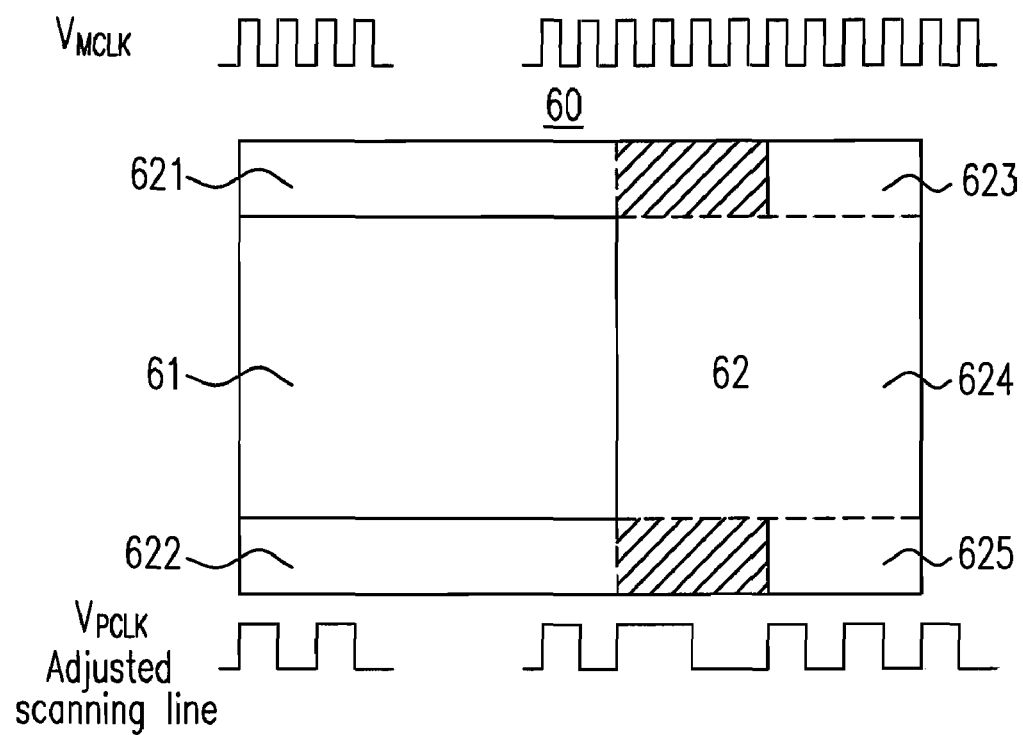
Figure 5C:
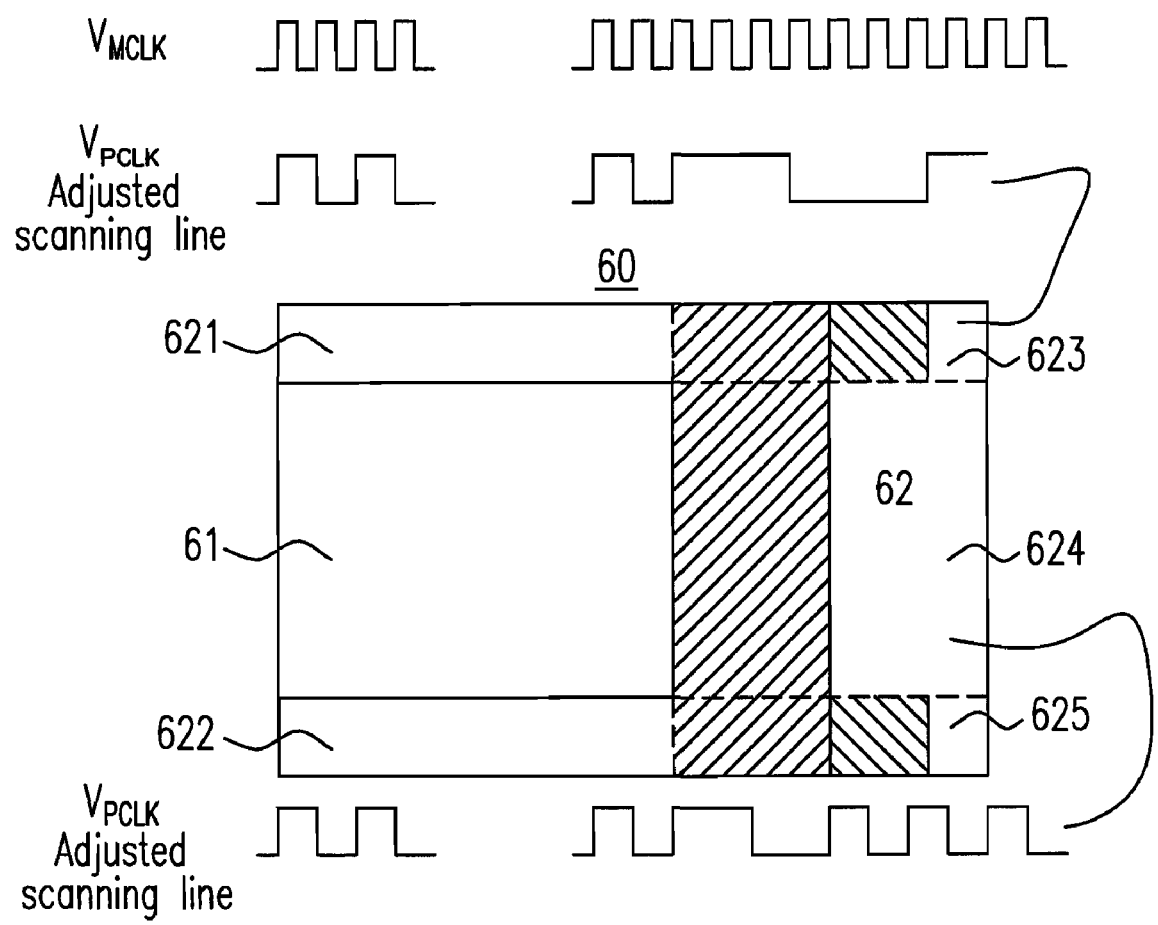

Please refer to FIG. 5(a), FIG. 5(b) and FIG. 5(c), which are schematic diagrams showing layouts of a picture area corresponding to a pixel clock signal according to the fifth embodiment of the present invention. In FIG. 5(a), FIG. 5(b) and FIG. 5(c), the picture area 60 controlled by the pixel clock signal $V_{PCLK}$ includes a display area 61 and a blanking area 62. The blanking area 62 is further districted into an upper sub-blanking area 621, a lower sub-blanking area 622, an upper-right sub-blanking area 623, a middle-right sub-blanking area 624, and a lower-right sub-blanking area 625. The period of the main clock signal $V_{MCLK}$ is constant, and the pixel clock signal $V_{PCLK}$ refers to the period of the main clock signal $V_{MCLK}$ for controlling a cyclic scan of the picture area. As shown in FIG. 5(a), in a state the first clock width of the pixel clock signal $V_{PCLK}$ is not adjusted, the period of the pixel clock signal $V_{PCLK}$ is two times as large as that of the main clock signal $V_{MCLK}$. As shown in FIG. 5(b), the clock controller 32 intermittently adjusts the first clock width of the pixel clock signal $V_{PCLK}$ in at least a blanking clock time corresponding to at least a sub-blanking area of the picture area. If at least a clock width corresponding to a pixel of the Kth scanning line in the sub-blanking area with the pixel is necessary to be adjusted, the clock width will be altered from originally two times, the period of the main clock signal $V_{MCLK}$, to other integer times.

Afterward, a preferred embodiment for intermittently adjusting the first clock width of the pixel clock signal $V_{PCLK}$ is described. As aforementioned, the clock controller 32 presets an index variable and a range of the index variable, analyzes the phase comparison signal $V_{PHASE}$, and adjusts the value of the index variable according to the phase relation obtained from the power source signal $V_{PSRC}$ and the vertical synchronous signal $V_{VSYNC}$. Then, the clock controller 32 intermittently adjusts the first clock width of the pixel clock signal $V_{PCLK}$ in at least a blanking clock time corresponding to at least a sub-blanking area of the picture area 60 based on the value of the index variable and a cyclic scanning specification of the picture area 60.

The clock controller 32 selects at least a first pixel of at least a sub-blanking area and adjusts the clock width corresponding to the first pixel according to the current value of the index variable. When a fluctuation value of the index variable can be used to adjust the clock width corresponding to the first pixel located in an area between the upper-right sub-blanking area 623 and the lower-right sub-blanking area 625 through referring to a default value of the index variable, which makes the vertical synchronous signal $V_{VSYNC}$ be nearly in phase with the power source signal $V_{PSRC}$, the clock controller 32 adjusts at least a second clock width of the pixel clock signal $V_{PCLK}$ by selecting at least a first pixel corresponding to the second clock width from at least an area between the upper-right sub-blanking area 623 and the lower-right sub-blanking area 625, which has priority.

As shown in FIG. 5(c), when the fluctuation value is larger and only adjusting at least the clock width through the area between the upper-right sub-blanking area 623 and the lower-right sub-blanking area 625 cannot make the vertical synchronous signal $V_{VSYNC}$ be nearly in phase with the power source signal $V_{PSRC}$, the clock controller 32 adjusts at least a third clock width of the pixel clock signal $V_{PCLK}$ by selecting at least a second pixel corresponding to the third clock width from at least an area among the upper-right sub-blanking area 623, the middle-right sub-blanking area 624, and the lower-right sub-blanking area 625 on a column basis according to the value of the index variable. Then, the clock controller 32 adjusts at least a fourth clock width of the pixel clock signal $V_{PCLK}$ by selecting at least a third pixel corresponding to the fourth clock width from at least an area between the upper-right sub-blanking area 623 and the lower-right sub-blanking area 625 according to an unprocessed remainder of the index variable.

Afterward, referring to FIG. 1 again, the image-clock adjusting method provided in the present invention is described. The method includes the following steps. Firstly, comparing a phase of a power source signal $V_{PSRC}$ with that of a first vertical synchronous signal $V_{VSYNC}$ produces at least a phase comparison signal $V_{PHASE}$. Next, a pixel clock signal $V_{PCLK}$ with a first clock width intermittently adjusted is produced based on the phase comparison signal $V_{PHASE}$ and the first vertical synchronous signal $V_{VSYNC}$. Next, a second vertical synchronous signal with a first phase approaching to a phase of the power source signal $V_{PSRC}$ is produced by finely adjusting the first vertical synchronous signal $V_{VSYNC}$ based on the pixel clock signal $V_{PCLK}$, and is fed back as the first vertical synchronous signal $V_{VSYNC}$.

The main features of the present invention are as follows. The clock width is dynamically adjusted by the technique of a digital circuit, which makes the frequency of the vertical synchronous signal of an image system approach that of the power source applied on the fluorescent lamp used for lighting. Therefore, the case the photo sensing of the CCD sensor varies can be avoided for effectively solving the problem of the color rolling. The clock width necessary to be altered can be suitably distributed to scanning lines of at least a sub-blanking area by means of dynamically adjusting the clock width of the pixel clock signal. As a result, the phenomenon of the color rolling can be significantly decreased.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims which are to be accorded with the broadest interpretation so as to encompass all such modifications and similar structures.

What is claimed is:

1. An image-clock adjusting circuit, comprising:
 a phase comparator receiving a power source signal and a vertical synchronous signal and comparing a phase of the power source signal with that of the vertical synchronous signal for producing at least a phase comparison signal;
 a clock controller receiving the phase comparison signal, the vertical synchronous signal and a main clock signal, producing a pixel clock signal, and intermittently adjusting a clock width of the pixel clock signal to produce an adjusted pixel clock signal; and
 a timing generator receiving the pixel clock signal and adjusting the vertical synchronous signal into an adjusted vertical synchronous signal being nearly in phase with the power source signal, wherein:
 the main clock signal has a first transition edge, a second transition edge lagged behind the first transition edge by a first integer of transition edges, and a third transition edge lagged behind the second transition edge by a second integer of at least one transition edge, wherein the first integer is different from the second integer;
 the adjusted pixel clock signal has a first cycle and a second cycle adjacent to the first cycle;
 the first cycle has a first width corresponding to a width between the first and the second transition edges; and
 the second cycle has a second width corresponding to a width between the second and the third transition edges.

2. An image-clock adjusting circuit according to claim 1, wherein the phase comparator further comprises:
 a first flip-flop having a first clock input terminal receiving the power source signal, and a first reset input terminal receiving a reset signal, for producing a first comparison signal of the phase comparison signal;
 a second flip-flop having a second clock input terminal receiving the vertical synchronous signal, and a second reset input terminal receiving the reset signal, for producing a second comparison signal of the phase comparison signal; and
 a NAND gate receiving the first comparison signal and the second comparison signal both reflecting a phase relation between the power source signal and the vertical synchronous signal for producing the reset signal.

3. An image-clock adjusting circuit according to claim 2, wherein the first comparison signal has a first pulse when the power source signal leads the vertical synchronous signal, and the second comparison signal has a second pulse when the power source signal lags behind the first vertical synchronous signal.

4. An image-clock adjusting circuit according to claim 1, wherein the clock controller further presets an index variable and a range thereof, wherein the value of the index variable is set at a midpoint of the range in an initial state, the clock controller analyzes the phase comparison signal, and adjusts the value of the index variable according to a phase relation obtained from the power source signal and the vertical synchronous signal, and the clock controller intermittently adjusts the clock width of the pixel clock signal according to the value of the index variable.

5. An image-clock adjusting circuit according to claim 1, wherein the clock controller refers to a period of the main clock signal for intermittently adjusting the clock width of the pixel clock signal.

6. An image-clock adjusting circuit according to claim 5, further comprising:
a color image processor receiving an image pickup signal and the pixel clock signal for producing an image post-processing signal; and
a television coder receiving the image post-processing signal, the main clock signal and the pixel clock signal for producing a display driving signal.

7. An image-clock adjusting circuit according to claim 1, wherein the pixel clock signal controls a cyclic scan of a picture area, the clock controller intermittently adjusts the clock width of the pixel clock signal in at least a blanking clock time corresponding to at least a sub-blanking area of the picture area, and a first frequency of the vertical synchronous signal is equal to a second frequency for displaying pixel fields on the picture area.

8. An image-clock adjusting circuit according to claim 1, wherein the timing generator further produces an image pickup control signal, and the adjusted vertical synchronous signal is fed back to the phase comparator and the clock controller.

9. An image-clock adjusting circuit according to claim 8, further comprising an image pickup device receiving the image pickup control signal for producing an image pickup signal.

10. An image-clock adjusting circuit according to claim 1, further comprising a formatter receiving an alternating-current voltage for producing the power source signal.

11. An image-clock adjusting method, comprising steps of:
(a) producing at least a phase comparison signal by comparing a phase of a power source signal with that of a first vertical synchronous signal;
(b) producing a pixel clock signal with a first clock width intermittently adjusted based on the phase comparison signal, the first vertical synchronous signal and a main clock signal, wherein the first clock width is intermittently adjusted to produce an adjusted pixel clock signal; and
(c) producing a second vertical synchronous signal with a first phase approaching to the phase of the power source signal by finely adjusting the first vertical synchronous signal based on the pixel clock signal, wherein:
the main clock signal has a first transition edge, a second transition edge lagged behind the first transition edge by a first integer of transition edges, and a third transition edge lagged behind the second transition edge by a second integer of at least one transition edge, wherein the first integer is different from the second integer;
the adjusted pixel clock signal has a first cycle and a second cycle adjacent to the first cycle;
the first cycle has a first width corresponding to a width between the first and the second transition edges; and
the second cycle has a second width corresponding to a width between the second and the third transition edges.

12. An image-clock adjusting method according to claim 11, wherein:
the phase comparison signal comprises a first comparison signal and a second comparison signal;
the first comparison signal has a first pulse when the power source signal leads the first vertical synchronous signal; and
the second comparison signal has a second pulse when the power source signal lags behind the first vertical synchronous signal.

13. An image-clock adjusting method according to claim 11, wherein the step (b) further comprises steps of:
obtaining a phase relation between the power source signal and the first vertical synchronous signal by analyzing the phase comparison signal;
adjusting a value of an index variable according to the phase relation; and
intermittently adjusting the first clock width of the pixel clock signal in at least a blanking clock time corresponding to at least a sub-blanking area of a picture area based on the value of the index variable and a cyclic scanning specification of the picture area.

14. An image-clock adjusting method according to claim 13, further comprising steps of:
predetermining the index variable and a range thereof;
setting the value of the index variable at a midpoint of the range in an initial state; and
intermittently adjusting the first clock width by referring to a period of the main clock signal.

15. An image-clock adjusting method according to claim 13, further comprising steps of:
increasing the value of the index variable when the power source signal leads the first vertical synchronous signal; and
decreasing the value of the index variable when the power source signal lags behind the first vertical synchronous signal.

16. An image-clock adjusting method according to claim 13, further comprising steps of:
decreasing the value of the index variable when the power source signal leads the first vertical synchronous signal; and
increasing the value of the index variable when the power source signal lags behind the first vertical synchronous signal.

17. An image-clock adjusting method according to claim 13, wherein the sub-blanking area further comprises an upper-right sub-blanking area, a middle-right sub-blanking area, and a lower-right sub-blanking area, and the method further comprises a step of:
adjusting at least a second clock width of the pixel clock signal by selecting at least a first pixel corresponding to the second clock width from at least an area between the upper-right sub-blanking area and the lower-right sub-blanking area according to the value of the index variable.

18. An image-clock adjusting method according to claim 13, wherein the sub-blanking area further comprises an upper-right sub-blanking area, a middle-right sub-blanking area, and a lower-right sub-blanking area, and the method further comprises steps of:
adjusting at least a third clock width of the pixel clock signal by selecting at least a second pixel corresponding to the third clock width from at least an area among the upper-right sub-blanking area, the middle-right sub-blanking area, and the lower-right sub-blanking area on a column basis according to the value of the index variable; and
adjusting at least a fourth clock width of the pixel clock signal by selecting at least a third pixel corresponding to the fourth clock width from at least an area between the upper-right sub-blanking area and the lower-right sub-blanking area according to an unprocessed remainder of the index variable.

* * * * *